United States Patent
Berezin et al.

(10) Patent No.: US 6,388,243 B1
(45) Date of Patent: May 14, 2002

(54) ACTIVE PIXEL SENSOR WITH FULLY-DEPLETED BURIED PHOTORECEPTOR

(75) Inventors: Vladimir Berezin; Eric R. Fossum, both of La Crescenta, CA (US)

(73) Assignee: Photobit Corporation, Pasadena, CA (US)

( * ) Notice: Subject to any disclaimer, the term of this patent is extended or adjusted under 35 U.S.C. 154(b) by 0 days.

(21) Appl. No.: 09/516,433

(22) Filed: Mar. 1, 2000

Related U.S. Application Data

(60) Provisional application No. 60/122,217, filed on Mar. 1, 1999.

(51) Int. Cl.[7] .......................... H01L 31/06; H01L 31/10
(52) U.S. Cl. ................ 250/208.1; 250/214.1; 257/292
(58) Field of Search ..................... 250/208.1, 208.2, 250/214 R, 214.1; 257/291, 292, 290, 257, 258, 35, 57, 431, 443, 461, 233, 234, 239

(56) References Cited

U.S. PATENT DOCUMENTS

| | | | |
|---|---|---|---|
| 4,242,695 A | * 12/1980 | Ouchi et al. ................. 257/292 |
| 5,471,515 A | 11/1995 | Fossum et al. | |
| 5,563,429 A | * 10/1996 | Isagai ........................... 257/258 |
| 5,567,632 A | * 10/1996 | Nakashiba et al. ........... 437/35 |
| 5,625,210 A | 4/1997 | Lee et al. | |
| 5,903,021 A | 5/1999 | Lee et al. | |
| 5,942,774 A | * 8/1999 | Isogai et al. ................. 257/292 |
| 6,040,593 A | * 3/2000 | Park ........................... 257/292 |
| 6,180,969 B1 | * 1/2001 | Yang et al. ................... 257/291 |
| 6,184,055 B1 | * 2/2001 | Yang et al. ................... 438/57 |

* cited by examiner

Primary Examiner—John R. Lee
(74) Attorney, Agent, or Firm—Fish & Richardson P.C.

(57) ABSTRACT

A fully depleted photodiode accumulates charge into both the diode and a separate floating diffusion. The floating diffusion has less capacitance that the overall diode, thereby resulting in a knee-shaped transfer characteristic for charge accumulation. The fully depleted photodiode also include two PN junctions, one near the surface and the other buried below the surface.

20 Claims, 3 Drawing Sheets

ACTIVE PIXEL SENSOR WITH FULLY-DEPLETED BURIED PHOTORECEPTOR

CROSS-REFERENCE TO RELATED APPLICATIONS

This application claims benefit of U.S. Provisional application No. 60/122,217, filed Mar. 1, 1999.

BACKGROUND

Active pixel sensors are well known in the art. The basic active pixel sensor is described in U.S. Pat. No. 5,471,515.

Active pixel sensors can use different kinds of active elements as their charge receiving elements. FIGS. 1A–1C show three different examples of three of the common image sensing active elements.

A basic photodiode active pixel is shown in FIG. 1A. This includes a photodiode 100 on the substrate below an active oxide 102. The photodiode is connected directly to an output transistor 104. A gate 106 connects the photodiode 100 to a diffusion region 108 that is held at voltage VDD.

The photodiode can be reset by activating gate 106, connecting the photodiode to VDD. Subsequent accumulation of charge changes the voltage on the photodiode.

The basic photogate active pixel sensor is shown in FIG. 1B. The active photogate 120 connects to the output transistor 122 through a transfer gate 124. This facilitates correlated double sampling in which the level of the photogate is first tested, then charge is transferred, and the value obtained again. Only the difference between the two charge amounts are used as an indication of the output. Hence, the output better indicates the amount of photogenerated electrons.

FIG. 1C shows the so-called pinned photodiode used as an active element in an active pixel sensor. The pinned photodiode is shown in U.S. Pat. No. 5,625,210. A transfer gate with channel implant 140 is used to transfer the charge out of the photodiode 142. The channel implant is used to adjust the bias of the pinned photodiode to facilitate charge output.

SUMMARY

The present system teaches using a fully-depleted buried photoreceptor with a coupled floating diffusion. The photoreceptor can be a "buried" diode, with an overlying portion of substrate.

BRIEF DESCRIPTION OF THE DRAWINGS

These and other aspects will be described in detail with reference to the accompanying drawings, wherein.

DESCRIPTION OF THE PREFERRED EMBODIMENTS

Figure 1A:
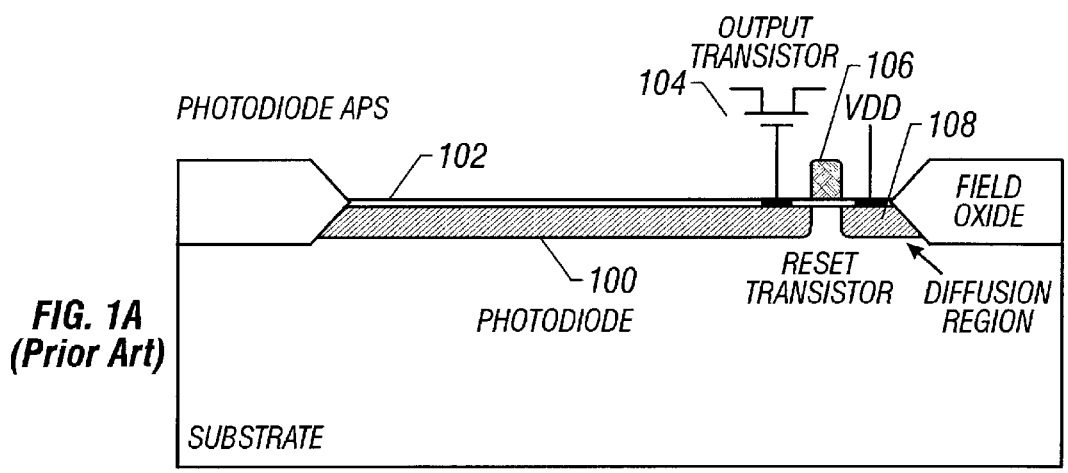
FIGS. 1A–1C show prior photosensitive elements as used in active pixel sensors.
Figure 1B:
Figure 1C:
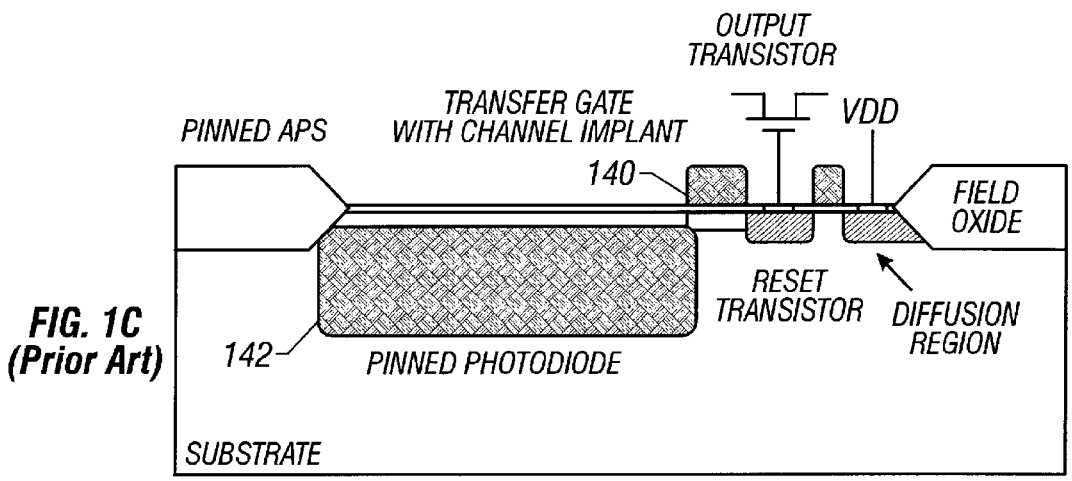
Figure 2A:
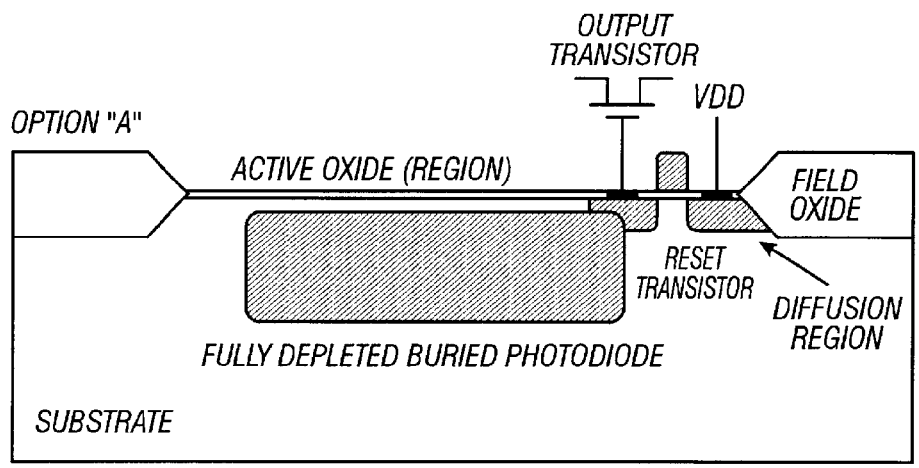
FIG. 2A shows a photosensor of an embodiment in which the output transistor is directly connected to the photosensor.
Figure 2B:
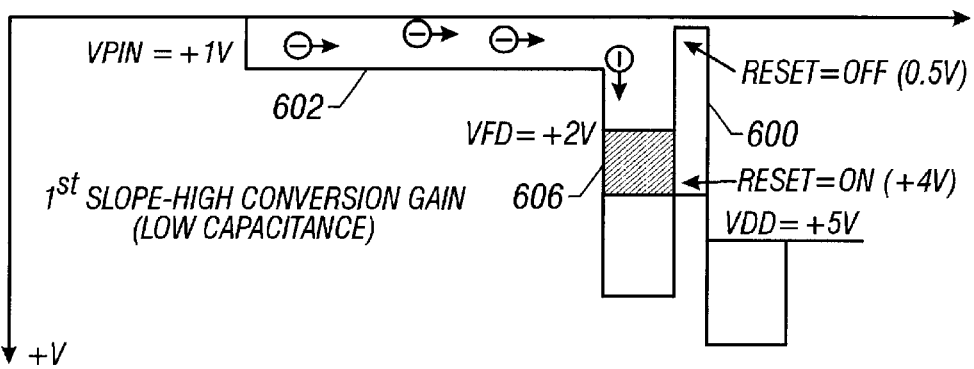
FIGS. 2B–2D show potential level diagrams for such a device.

An embodiment uses a fully depleted buried photodiode 200 as the photosensitive element. This photodiode is connected to a floating diffusion 205. That diffusion forms the output, either directly or via a transfer gate. The floating diffusion 205 is connected to an output transistor 210, e.g. a transistor that is configured as a source follower. A reset transistor 205 has a gate 206 that is activated to connect floating diffusion to a diffusion region 208 that is held at VDD. This resets photodiode 200. The floating diffusion with reset transistor forms a vertical diffusion shield 600 located between the depleted photodiode 200 and the diffusion region 208. This is shown in FIG. 2B.

The buried photodiode allows two PN junctions for photocarrier conversion. Assuming that the buried photodiode 200 is of N-type, there is a first PN junction between the P-type substrate material 212 above the photodiode and the N-type photodiode itself. A second PN junction exists between the N-type photodiode 200 and the underlying P-type material 214. By using two PN junctions, the photosensitivity in specific spectral ranges can be enhanced. For example, the upper PN junction near 212 may increase the photosensitivity to blue and green. The lower PN junction may increase the photosensitivity to green and red. Surface components can constitute one of the largest sources of leakage current for PN junction technologies. In addition, the dark current can be reduced by eliminating certain surface components.

The two different embodiments are optimized for different applications. The first embodiment is shown in FIG. 2A. A silicon substrate 199 has a buried, fully depleted photodiode 200 formed therein. For purposes of this illustration, the photodiode will be assumed to be of N-type, in a P-type substrate. A layer of P material 212 overlies the top surface 216 of the photodiode, and the P-type material 199 surrounds all sides of the fully depleted photodiode.

The upper surface of the silicon includes an active oxide region 220, and a field oxide region 222. A space 224 is left between the edges of the photodiode 200 and the field oxide 222. This space 224 has been found to avoid mechanical stresses from the field oxide.

In the FIG. 2 embodiment, the floating diffusion region 205 is connected directly to the photodiode 200. This floating diffusion region 205 can have the same impurity as the buried photodiode but at a higher concentration. The floating diffusion 205 is also connected to the output transistor 210. In addition, the floating diffusion is connected through a surface gate 206 to a diffusion region 208 that is biased at VDD.

Figure 2C:
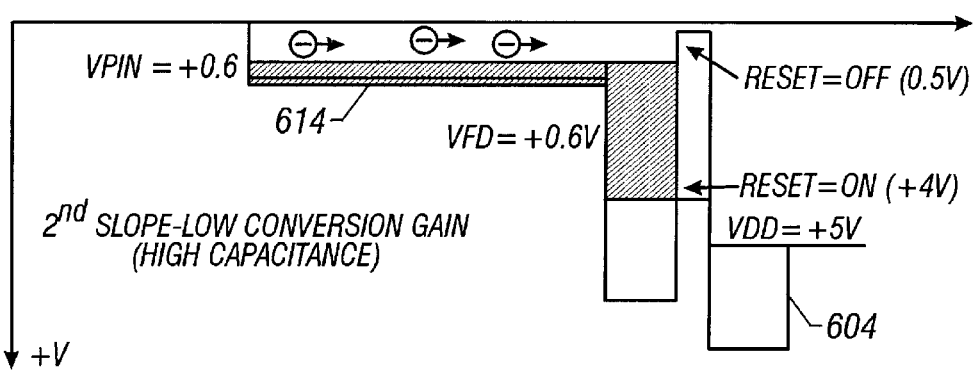

Operation is shown in FIGS. 2B and 2C. Actuating the reset gate 206 brings the floating diffusion 205 to VDD, thereby lowering the vertical diffusion shield 600, and allowing any charge in the photodiode (shown as 602) to dump into the diffusion region 604. Turning off the-reset transistor 206 again raises the vertical diffusion bridge 600, and thereby again causes the charge to accumulate.

Figure 2D:
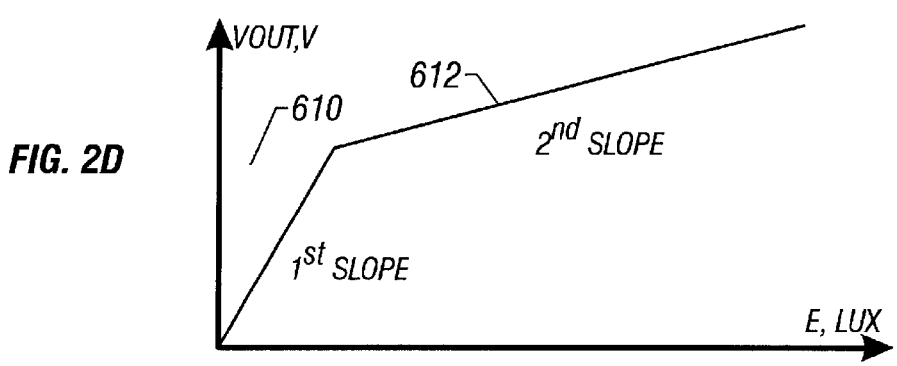

The charge accumulation occurs in two different stages which produces effectively a knee-shaped response slope. The slope of Voltage out as a function of incoming light is shown in FIG. 2D. The first slope 610 occurs during the first part of the signal accumulation. During the part, the charge can accumulate in a relatively small "bucket", shown as portion 606. This small bucket represents the floating diffusion. This relatively small bucket has low capacitance, and hence can accumulate the charge particles quickly. This charge accumulates in the small bucket, according to a first response slope shown as the first slope portion 610.

Once the small bucket portion is filled (effectively the floating diffusion 205 is filled with charge), then charge begins accumulating in the higher-potential buried diode portion 200. This charge accumulation is held in a larger bucket. The accumulation in the larger bucket is shown as 614. The operation produces a voltage-to-light transfer characteristics of a second slope 612.

The knee-shaped accumulation can be used for certain advantageous operations. A reason for obtaining the knee-shaped accumulation in this embodiment, however, is to compress the higher light portion, and accentuate the lower light portion. This enables the system to therefore obtain a larger dynamic range.

Figure 3A:
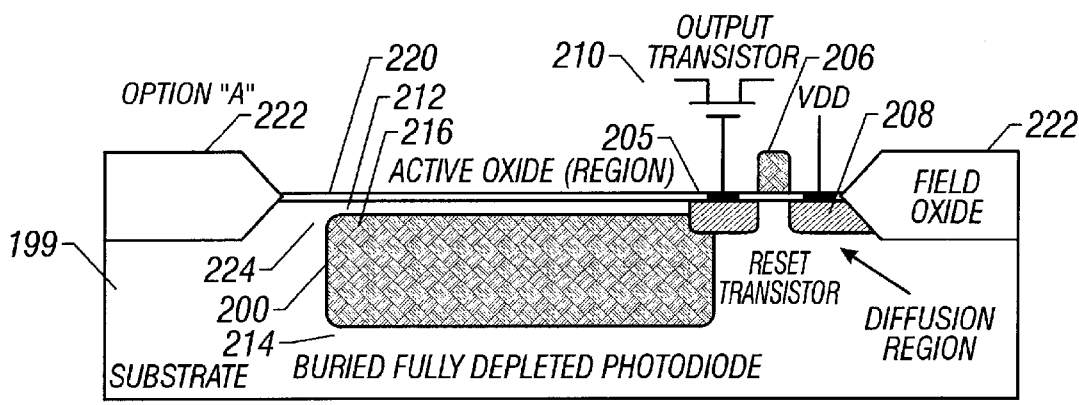
FIG. 3 shows an alternative system in which a transfer gate is use to support correlated double sampling
Figure 3B:
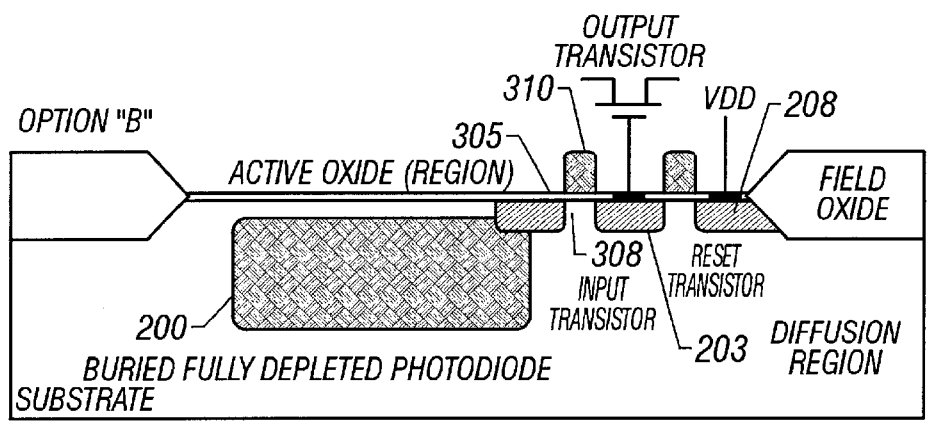

A second embodiment is shown in FIG. 3. In this embodiment, a separate floating diffusion 305 is in contact with the buried fully depleted photodiode 200. A separate input transistor 308 separates between the floating diffusion 305 and the output floating diffusion 205 connected to output transistor 210. The output floating diffusion 205 is also connected to the diffusion region in a similar way to that described above in the FIG. 2 embodiment. The input transistor 308 can be used to separate the two processes of photocharge integration and signal charge readout to facilitate correlated double sampling in order to reduce the KTC noise and parallel shutter. Like in the first embodiment, this system uses a controllable vertical diffusion bridge 305 to control the charge from the fully depleted photodiode. This system also leaves a space 224 between the top surface of the photodiode and the silicon substrate, thereby providing the same material as the silicon substrate above the photodiode as below the photodiode.

Figure 4:
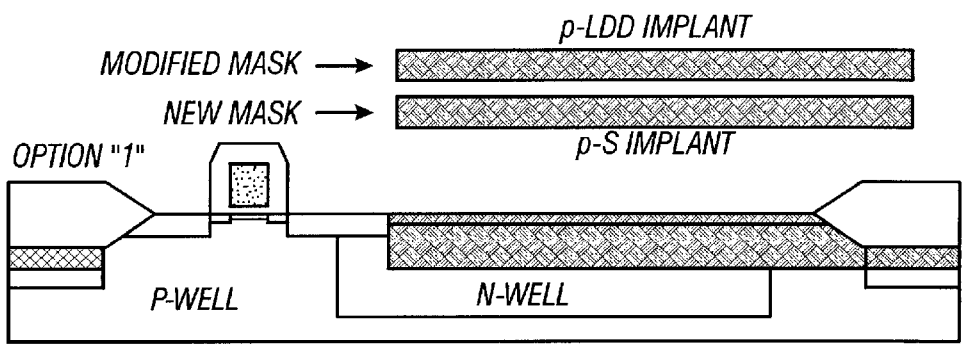
FIG. 4 shows a fabrication layout of the system using a P-type buried photosensor with an N-well and a P-well.
Figure 5:
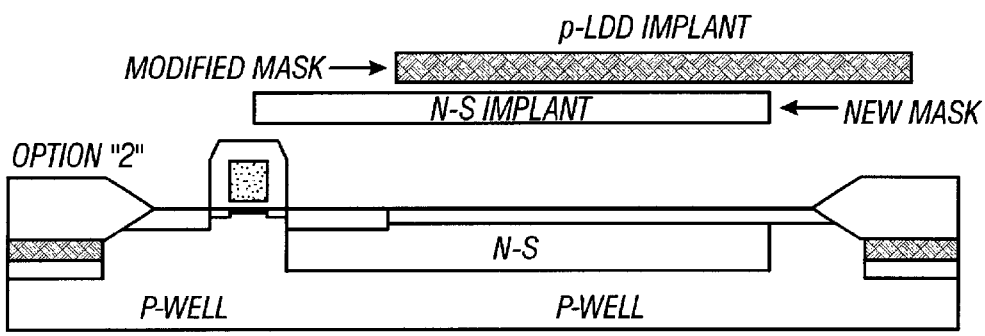
FIG. 5 shows a N-type buried device.

Implementation is shown in FIGS. 4 and 5, which show the wells that are used and the masks used to form those wells. FIG. 4 shows a deep buried photodiode using an N-well. In this embodiment, the photodiode is buried more deeply. FIG. 5 shows a shallow buried photodiode using a P-well. As discussed above, the shallow and deep burying at the wells can be used for different purposes.

Correlated double sampling occurs as follows. First, the whole system is reset by turning on the reset transistor gate 206 at the same time that the input transistor gate 310 is activated. This has the effect of resetting the floating diffusion 205, the second floating diffusion 305, and the buried fully depleted photodiode 200. After that, the gate 206 is turned off to raise the vertical diffusion bridge. At that time, the output transistor 210 is used to sample the value on floating diffusion 205. This represents the reset level. The output transistor 308 is then turned off, and charge is allowed to accumulate. At the end of the charge accumulation, the output transistor 308 is turned back on, allowing the output transistor 210 to sample the value of charge stored in the photodiode.

This system enables increasing the quantum efficiency or spatial resolution. Since the spatial resolution is proportional to the pixel size, this system could obtain an increased internal gain.

Although only a few embodiments have been described in detail above, other embodiments are contemplated by the inventor and are intended to be encompasses within the following claims. In addition, other modifications are contemplated and are also intended to be covered.

What is claimed is:

1. A photosensor comprising:
   a semiconductor substrate;
   a buried photodiode in said semiconductor substrate, having a top surface which is separated from a surface of the substrate by a first area of the substrate, and a bottom surface which contacts said substrate; and
   a photocarrier reading element which has a transfer curve with a first portion for a first part of incoming light, that has a first slope, and a second portion for a second part of the light that has a second slope, where said second slope is more gradual than said first slope.

2. A photosensor as in claim 1 wherein said photocarrier reading element includes a floating diffusion, wherein said floating diffusion fills with charge to produce said second slope, and said photodiode fills with charge to produce said first slope.

3. A photosensor as in claim 2 further comprising a controllable vertical diffusion bridge to control accumulation exchange in said photodiode.

4. A photosensor as in claim 3 wherein said controllable vertical diffusion bridge is formed by a reset transistor.

5. A photosensor as in claim 2 further comprising a second diffusion region, separating said photodiode from said floating diffusion region.

6. A photosensor as in claim 5 further comprising a controlling transistor, controlling whether said first diffusion region will be coupled to said floating diffusion region.

7. A photosensor as in claim 3 wherein said substrate is a continuous material from said first area to said bottom area.

8. A photosensor as in claim 3 further comprising an output transistor, configured as a follower, and connected directly to said floating diffusion.

9. A photosensor comprising:
   a semiconductor substrate having an upper surface;
   a photodiode, which is fully depleted, is formed of a first conductivity type material, and is buried below said upper surface to leave a portion of the substrate over the photodiode and a portion of the substrate below the photodiode;
   a floating diffusion region, formed of the same conductivity type of material as the photodiode, and coupled to the photodiode; and
   a reset element, selectively erecting a vertical diffusion bridge, which when lowered, allows charge in the photodiode and floating diffusion to spill to and which when raised maintains charge in said floating diffusion and photodiode.

10. A photosensor as in claim 9, wherein said semiconductor substrate is an opposite conductivity type to said photodiode.

11. A photosensor as in claim 9, further comprising a second diffusion, coupled to said photodiode; and
   a transistor separating between said second diffusion and said floating diffusion region, said second transistor selectively turned on to transfer charge to said floating diffusion region.

12. A photosensor as in claim 9 further comprising a reset diffusion and said reset element is lowered to transfer charge to said reset diffusion.

13. A method comprising:
   using a buried photodiode to accumulate charge in a way that produces a transfer characteristic having a first steeper slope for lower light levels and a second more gradual slope for higher light levels.

14. A method as in claim 13, wherein said using comprises coupling said buried photo diode directly to a floating diffusion with no transfer gate therebetween.

15. A method as in claim 13, further comprising causing a diffusion shield to be erected to accumulate said charge.

16. A photo sensor as in claim 9,wherein said floating diffusion region is directly coupled to the photo diode with no transfer gate therebetween.

17. A photo sensor as in claim 9, further comprising a transfer gate, coupled between said photo diode and said floating diffusion region.

18. A photo sensor, comprising:

a semiconductor substrate;

a buried photo diode in said semiconductor substrate, defining a first PN junction, and a second PN junction, wherein said first and second PN junctions have different characteristics, and where said first PN junction is optimized for receiving incoming radiation having different characteristics then said second PN junction.

19. A photo sensor as in claim 18, further comprising a photo carrier reading element which has a transfer curve with a first portion for a first part of incoming radiation that has a first slope and a second portion for a second part of incoming radiation that has a second slope.

20. A photo sensor as in claim 18, wherein one of said PN junctions is optimized for photosensitivity to blue and green, and another of said PN junctions is optimized for photosensitivity to green and red.

* * * * *

UNITED STATES PATENT AND TRADEMARK OFFICE
CERTIFICATE OF CORRECTION

PATENT NO. : 6,388,243 B1 Page 1 of 1
DATED : May 14, 2002
INVENTOR(S) : Eric R. Fossum, Ph.D. and Vladimir Berezin It is certified that error appears in the above-identified patent and that said Letters Patent is hereby corrected as shown below:

<u>Column 4,</u>
Lines 61 and 66, please replace "photo diode" with -- photodiode --.
Line 65, please replace "photo sensor" with -- photosensor --.

<u>Column 5,</u>
Lines 1 and 4, please replace "photo sensor" with -- photosensor --.
Lines 2 and 6, please replace "photo diode" with -- photodiode --.

<u>Column 6,</u>
Lines 1 and 6, please replace "photo sensor" with -- photosensor --.
Line 2, please replace "photo carrier" with -- photocarrier --.

Signed and Sealed this

Eighteenth Day of February, 2003

JAMES E. ROGAN
*Director of the United States Patent and Trademark Office*